(12) United States Patent
Michalewicz et al.

(10) Patent No.: US 8,033,091 B2
(45) Date of Patent: Oct. 11, 2011

(54) QUANTUM TUNNELLING TRANSDUCER DEVICE

(75) Inventors: Marek Michalewicz, West Footscray (AU); Zygmunt Rymuza, Warsaw (PL)

(73) Assignee: Quantum Precision Instruments Asia PTE Ltd., Singapore (SG)

( * ) Notice: Subject to any disclaimer, the term of this patent is extended or adjusted under 35 U.S.C. 154(b) by 729 days.

(21) Appl. No.: 10/554,312

(22) PCT Filed: Apr. 22, 2004

(86) PCT No.: PCT/AU2004/000523
§ 371 (c)(1),
(2), (4) Date: Aug. 24, 2006

(87) PCT Pub. No.: WO2004/094956
PCT Pub. Date: Nov. 4, 2004

(65) Prior Publication Data
US 2006/0285789 A1    Dec. 21, 2006

(30) Foreign Application Priority Data
Apr. 22, 2003  (AU) ................................ 2003901914

(51) Int. Cl.
*G01D 5/14*   (2006.01)
(52) U.S. Cl. ................ 57/414; 438/50; 438/51; 438/52; 438/53; 257/415; 257/416; 257/417; 257/418; 257/419; 257/E27.006; 977/724; 977/725; 977/732; 977/733
(58) Field of Classification Search .......... 257/414–419, 257/E27.006; 438/50–53; 977/724, 725, 977/732, 733
See application file for complete search history.

(56) References Cited

U.S. PATENT DOCUMENTS

| 3,396,317 | A | * | 8/1968 | Vendelin ........................ 257/654 |
| 4,028,718 | A | * | 6/1977 | Migitaka et al. ............... 257/426 |
| 4,373,165 | A | * | 2/1983 | Tasch, Jr. ....................... 257/497 |
| 4,806,755 | A |   | 2/1989 | Duerig et al. |
| 5,265,470 | A | * | 11/1993 | Kaiser et al. ................. 73/178 R |
| 5,367,136 | A | * | 11/1994 | Buck ............................. 200/600 |
| 5,389,182 | A | * | 2/1995 | Mignardi ...................... 156/701 |
| 5,461,916 | A | * | 10/1995 | Fujii et al. .................. 73/514.32 |
| 5,756,895 | A | * | 5/1998 | Kubena et al. ............. 73/504.15 |
| 5,905,202 | A | * | 5/1999 | Kubena et al. ............. 73/504.15 |

(Continued)

FOREIGN PATENT DOCUMENTS
WO    97/20189    6/1997
(Continued)

OTHER PUBLICATIONS
Merriam-Webster OnLine Dictionary definition of transverse.*
(Continued)

*Primary Examiner* — Hrayr Sayadian
(74) *Attorney, Agent, or Firm* — Foley & Lardner LLP

(57) ABSTRACT

A monolithic micro or nano electromechanical transducer device includes a pair of substrates (20, 25) respectively mounting one or more elongate electrical conductors (40) and resilient solid state hinge means (30, 32) integral with and linking the substrates to relatively locate the substrates so that respective elongate electrical conductors (40) of the substrates are opposed at a spacing that permits a detectable quantum tunnelling current between the conductors when a suitable electrical potential difference is applied across the conductors. The solid state hinge means permits relative parallel translation of the substrates transverse to the elongate electrical conductors.

20 Claims, 3 Drawing Sheets

U.S. PATENT DOCUMENTS

| | | | | |
|---|---|---|---|---|
| 5,977,596 | A * | 11/1999 | Rountree et al. | 257/363 |
| 5,994,750 | A * | 11/1999 | Yagi | 257/415 |
| 6,041,563 | A * | 3/2000 | Vollers | 52/281 |
| 6,137,206 | A * | 10/2000 | Hill | 310/306 |
| 6,495,905 | B2 * | 12/2002 | Frazier et al. | 257/587 |
| 6,534,839 | B1 * | 3/2003 | Frazier et al. | 257/421 |
| 6,555,404 | B1 * | 4/2003 | Kubena et al. | 438/22 |
| 6,674,141 | B1 * | 1/2004 | Kubena et al. | 257/417 |
| 6,707,308 | B1 * | 3/2004 | Michalewicz | 324/716 |
| 7,177,505 | B2 * | 2/2007 | Willcox | 385/52 |
| 7,279,760 | B2 * | 10/2007 | Viefers et al. | 257/415 |
| 2002/0153583 | A1 * | 10/2002 | Frazier et al. | 257/448 |
| 2002/0153584 | A1 * | 10/2002 | Frazier et al. | 257/448 |
| 2003/0036244 | A1 * | 2/2003 | Jones et al. | 438/397 |

FOREIGN PATENT DOCUMENTS

| | | |
|---|---|---|
| WO | 00/14476 | 3/2000 |
| WO | WO 00/14476 * | 3/2000 |

OTHER PUBLICATIONS

Merriam-Webster OnLine Dictionary definition of lateral.*
Merriam-Webster OnLine Dictionary definition of "transverse," no date.*
Merriam-Webster OnLine Dictionary definition of "lateral," no date.*

* cited by examiner

QUANTUM TUNNELLING TRANSDUCER DEVICE

FIELD OF THE INVENTION

This invention relates to the accurate measurement and monitoring of fine relative movements or displacements, for example linear or angular separations or translations. The invention has particular utility in the detection of displacements of micro or nano order. Of particular though not exclusive interest is the measurement of vibrations, and quantities derived from positional transduction.

BACKGROUND ART

There have been a number of published proposals for the use of detectable changes in quantum tunneling current to measure micro or nano order displacements or motions. For example, Kobayashi et al, have proposed a displacement detector for a micro structure such as an atomic force microscope probe that relies on the extreme sensitivity of a tunneling current to the length of a gap, in the order of 1 nm, between a sample and a sharpened metallic tip. An earlier related disclosure by Kobayashi et al "An integrated tunneling unit" appears in Proceedings of MEMS 1992, Travemünde (Germany), Feb. 4-7, 1992. In an extract entitled "Microsensors get tunnelling" in Design Engineering (Morgan Grampian Ltd, London, U.K.), 1 Nov. 1997, there is a disclosure of an accelerometer that relies on tunnel current effects fabricated in a silicon-on-insulator (S.O.I.) wafer. This device, and a micro-mechanical atomic force sensor head disclosed in European patent publication 262253, rely on the sensitivity of detected quantum tunneling current to the variable width of a gap, typically between a tip and an opposed surface. That is, the tip and surface move towards and away from each other.

Other disclosures of arrangements utilising quantum tunneling between a tip and opposed surface are to be found in U.S. Pat. No. 4,806,755 and international patent publication WO 97/20189.

The present applicant's prior international patent publication WO 00/14476 discloses micromechanical apparatus for measuring or monitoring the relative position or displacement of two elements in which a pair of elongate electrical conductors are disposed at a mutual separation such that, on application of an electrical potential difference across the conductors, there is a detectable quantum tunneling current between the conductors. This device is sensitive to the degree of alignment, either lateral or angular, between the opposed conductors. In one form of the device, respective substrates mount opposed arrays of conductors at a spacing in the range 2 to 100 angstroms. Disclosed arrangements for accurately maintaining this gap include the use of C60 nanobearings or a separation film of an organic medium such as cyclohexane.

The concepts and structures disclosed in WO 00/14476 have great promise for a wide variety of applications at micro and nano level. It is an object of the present invention to provide a class of practical devices embodying those concepts.

SUMMARY OF THE INVENTION

The present invention is essentially directed to a monolithic MEMS or NEMS structure for applying the concepts disclosed in international patent publication WO 00/14476, which structure allows parallel translation of a pair of opposed substrates.

The invention accordingly provides a monolithic micro or nano electromechanical transducer device including:
 a pair of substrates respectively mounting one or more elongate electrical conductors; and
 resilient solid state hinge means integral with and linking said substrates to relatively locate the substrates so that respective said elongate electrical conductors of the substrates are opposed at a spacing that permits a detectable quantum tunneling current between the conductors when a suitable electrical potential difference is applied across the conductors;
 wherein said solid state hinge means permits relative parallel translation of said substrates transverse to said elongate electrical conductors.

Preferably, the opposed elongate electrical conductors mounted on the respective substrates are substantially parallel.

Advantageously, said resilient solid state hinge means is dimensioned to have a substantially lower stiffness in a selected direction relative to a direction orthogonal to the selected direction.

In an embodiment, said solid state hinge means comprises at least one outstanding pillar or post from one of said substrates and a web integrally joining the pillar to an edge region of the other substrate. For detecting linear translation, said hinge means would conveniently comprise a pair of solid state hinges, while detection of rotational or angular translation motion would typically require one or four solid state hinges.

In an advantageous device, the respective substrates are typically planar plates or wafers each of substantially uniform thickness and one overlying the other. Rectangular or square plates or wafers are advantageous, although in the case of four angularly spaced solid state hinges, one of the substrates is conveniently of disc form.

BRIEF DESCRIPTION OF THE DRAWINGS

The invention will now be further described, by way of example only, with reference to the accompanying drawings in which.

EMBODIMENTS OF THE INVENTION

Figure 1:
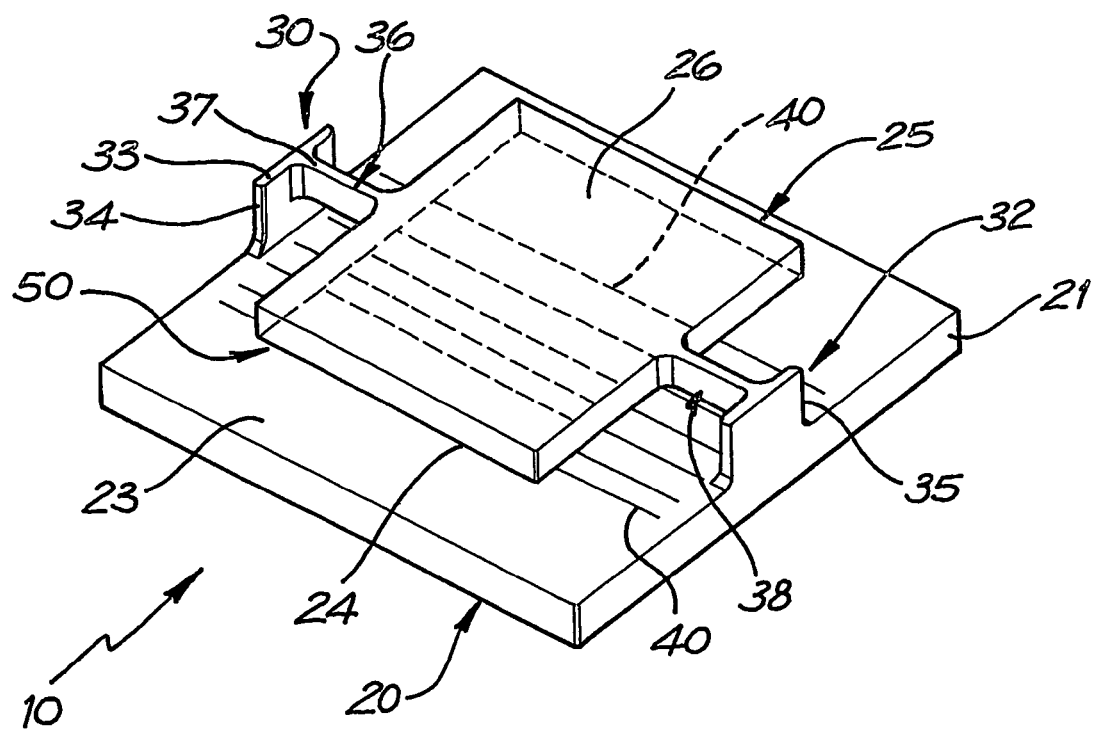
FIG. 1 is an isometric view of a monolithic transducer device according to an embodiment of the invention, having a pair of integral solid state hinges and especially suitable for measuring linear vibrations.
Figure 2:
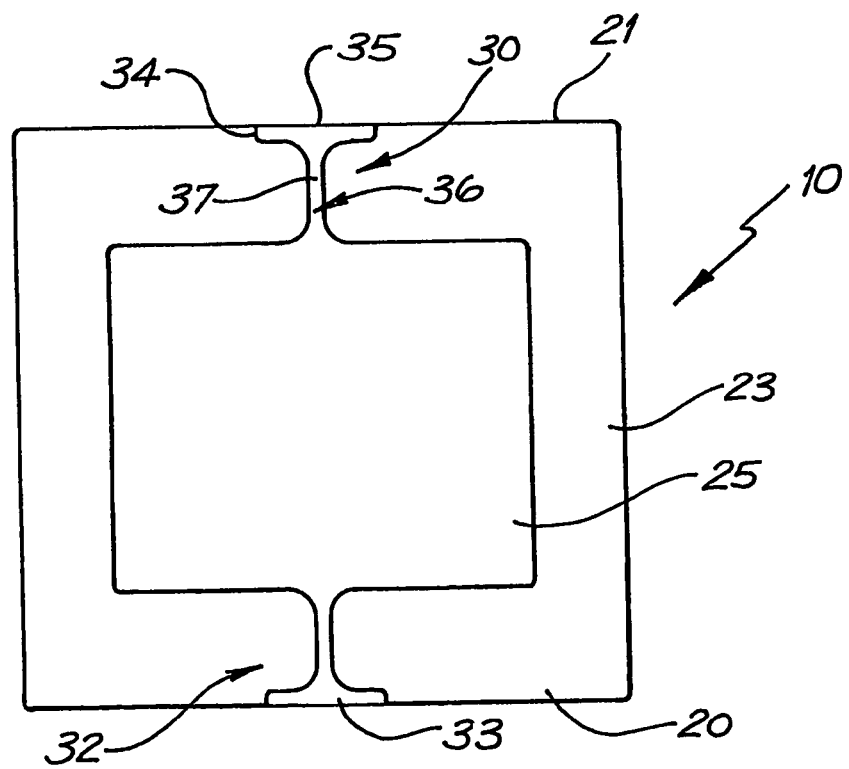
FIGS. 2 and 3 are respectively a plan view and a side elevational view of the device illustrated in FIG. 1.
Figure 3:
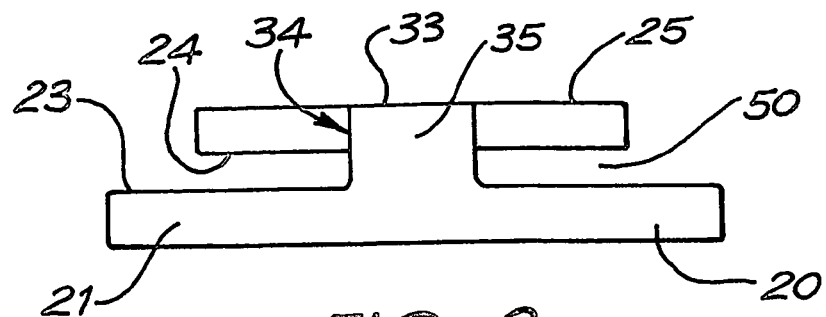

The transducer device 10 depicted in FIGS. 1 to 3 is an integrated monolithic structure typically formed in a material of a type suitable for the manufacture of micro- or nano-structures, for example silicon or gallium arsenide. The device comprises a pair of rectangular plates or wafers 20, 25, one 20 being larger than the other and forming a base for the structure, and the other 25 being suspended over base plate 20 from a pair of resilient solid state hinge structures 30, 32. In this particular embodiment, each plate or wafer 20, 25 is of uniform thickness, and plate 25 is positioned centrally symmetrically over base plate 20.

Hinge structures 30, 32 are integral with substrate plates 20, 25. Each comprises a wall-like pillar 34 upstanding from base plate 20. In this particular embodiment, each pillar 34 is at an edge of base plate 20, and the outer face 35 of the pillar is flush with the edge face 21 of the base plate, but other arrangements are of course possible. Suspended plate 25 is linked to pillars 34 by respective elongate hinge webs 36, 38 that join opposite sides of plate 25 to the inside face of pillars 34 in mutual coplanar alignment. In this particular configuration, hinge webs 36 are of a width equal to the thickness of plate 25 and arranged so that their upper and lower edges 37 are flush with the respective upper and lower faces 24 of plate 25 and so that their upper edge 37 is flush with and orthogonally arranged with respect to the upper edge 33 of pillar 34.

It will be understood that because hinge webs 36 are relatively thin in a direction parallel to plates 20, 25 but of relatively large dimension in a direction normal to the plates, the hinges are highly bendable, that is have very low motion resistance, in the parallel direction but are highly stiff and resistant to movement in the normal direction.

The opposed faces 23, 24 of plates 20, 25 are parallel to a high degree of accuracy, and are set at a uniform spacing or gap 50 at which there can be a detectable quantum tunneling current between opposed conductors 40 in these faces. For utility as a micro- or nano- electromechanical device, these faces 23, 24 have embedded elongate electrical conductors 40, where the elongate electrical conductors 40 embedded on the surface 23 and the elongated electrical conductors 40 embedded on the surface 24 are disposed in directly opposed pairs aligned parallel with the plane of hinge webs 36. Suitable electrical contacts 42 are provided on plates 20, 25 for applying an appropriate electrical potential difference across the opposed conductor pairs to give rise to detectable quantum tunneling current across gap 50. Electrical connections between contacts 42 and conductors 40 can be integrated through the hinge webs 36.

As explained in the aforementioned international patent publication WO 00/14476, this quantum tunneling current is critically dependent on the spacing between the conductors because the quantum wave function decays exponentially outside the conductor surface, and the detected current will also be a function of any lateral overlap or relative angle between a pair of opposed conductors. The device takes advantage of this linear relationship in that the detected value of the tunneling current will change as opposed conductors move out of alignment with any relative parallel translational movement of plates 20, 25 transverse to the conductors as the hinge webs 36 bend.

In a particularly suitable application of the transducer device 10 of FIGS. 1 to 3, linear vibratory motions transverse to the plane of hinges 36 may be detected where the base plate 20 is affixed to a surface and vibration in the surface causes relative vibration of plate 25 on hinge webs 36. A transducer of the illustrated kind at micro or nano dimensions can function at high frequencies and hence can be used as a sensor of high frequency vibrations, by detecting the peaks in quantum tunneling current as the opposed conductors oscillate in and out of alignment.

Another application of the transducer device depicted in FIGS. 1 to 3 is as a flow meter in which plate 25 projects into and responds to the flow. It will be appreciated that the device can be generally applied to the measurement of any quantities derived from positional transduction.

Figure 4:
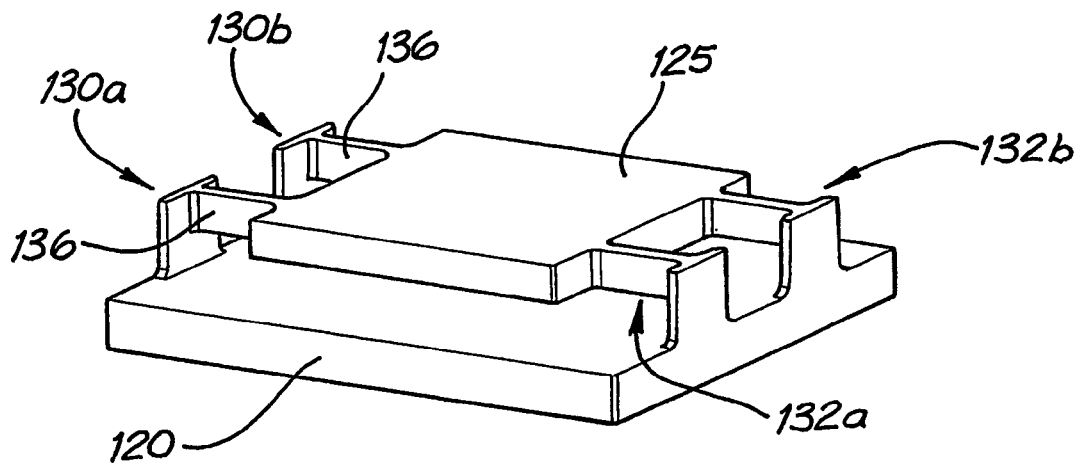
FIG. 4 is a view similar to FIG. 1 but from a different angle, of a modified form of the device depicted in FIG. 1, having four integral solid state hinges.
Figure 5:
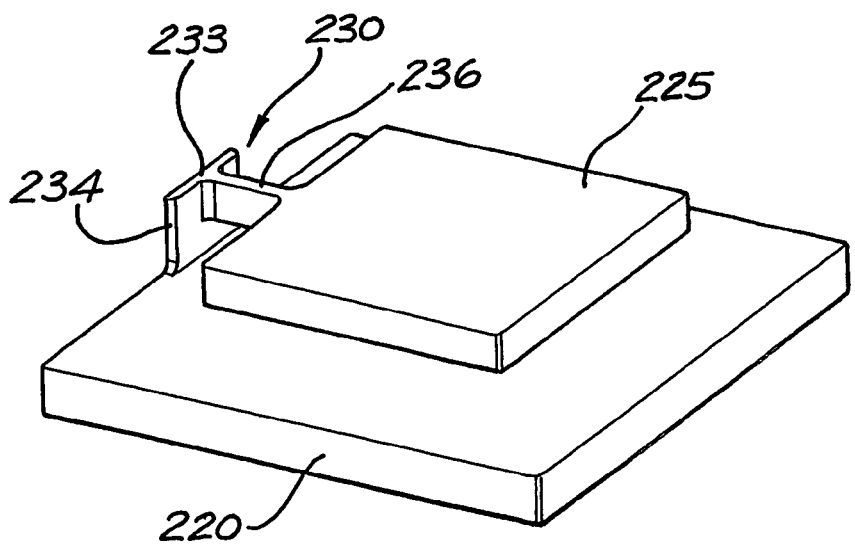
FIG. 5 depicts a modified form of the device shown in FIG. 1 having one hinge so as to be sensitive to rotational translations or vibrations.
Figure 6:
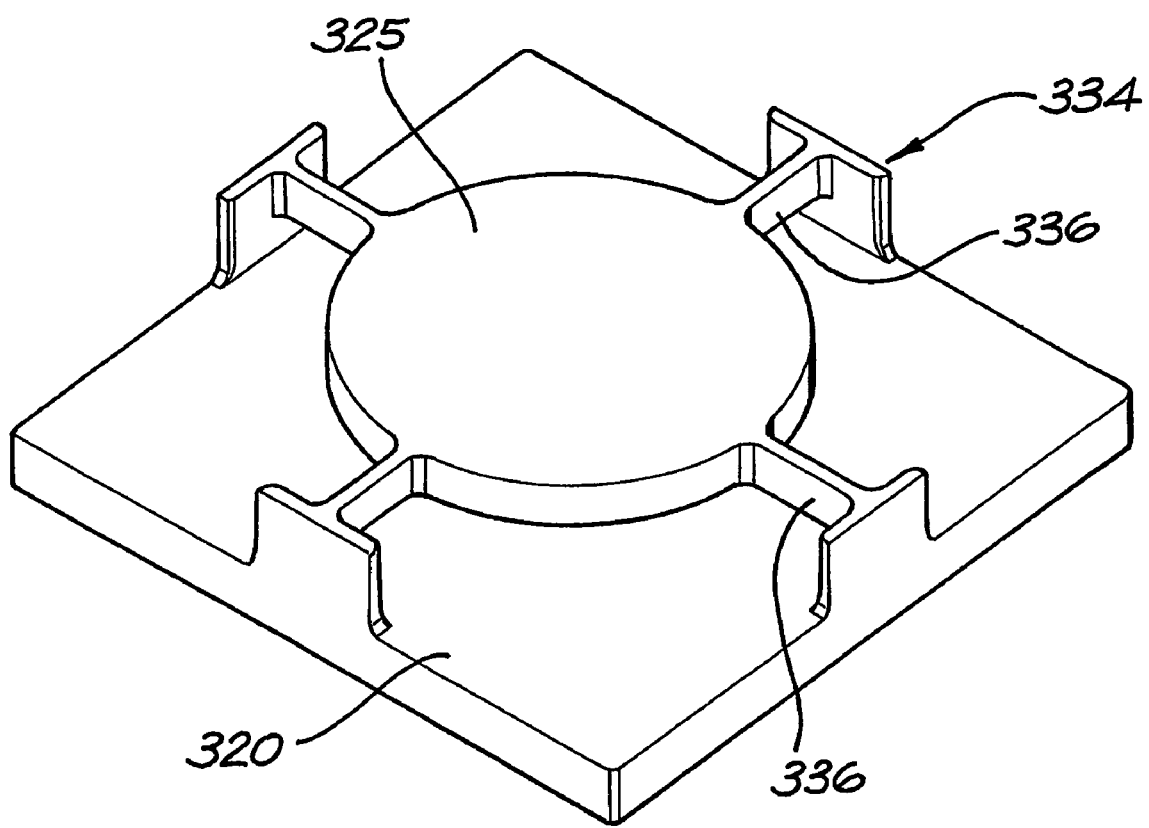
FIG. 6 is a similar view of a device having four solid state hinges equally angularly arranged around a disc substrate.

FIGS. 4 to 6 illustrate further embodiments of monolithic micro or nano devices having alternative characteristics or applications. The structure of FIG. 4 is similar to FIG. 1 except that it has two hinge webs 130a, 130b; 132a, 132b on either side of the suspended plate 125. This design allows linear motion of the suspended plate 125 with respect to the base plate 120 when the dimensions of the plates are larger than in the case of FIG. 1.

Conversely, the structure of FIG. 5 has only one web hinge 230 so that the smaller plate 225 projects cantilever fashion from the single post 234. This design allows angular rotation of the cantilevered plate with respect to the base plate. The structure of FIG. 6 is also applicable to relative angular rotation of the plates. Here, the suspended plate has four equiangularly spaced radially extending hinge webs 336 to ensure better, more accurate positioning of the plates and to provide a quite different response.

An exemplary size range for the illustrated structures would involve a suspended plate dimension (edge length or diameter) in the range 100 μm to 100 nm. Typical hinge dimensions would comprise length 100 μm to 100 nm, width 50 μm to 50 nm and thickness 50 μm to 10 nm.

Any of a variety of known fabrication methods could be employed in the manufacture of the devices of the invention. Appropriate such methods might include:

(1) focussed ion beam (FIB) for interplate gaps 50 of about 15 nm or less.
(2) silicon-on-insulator (SOI) for interplate gaps of 5 nm or less.
(3) sacrificial removal of gap material using reactive ion etch (RIE).
(4) STM/AFM electrochemical etches.

Another alternative would be to fabricate the two plates separately, eg. by depositing a self-aligned molecular (SAM) layer on the bottom surface, and then welding the two plates to form the hinges, for example by FIB, followed by evaporation of the SAM layer. In this case, the interplate gap would be related to the thickness of SAM material.

For a gap of 1 nm or less, presently known fabrication methods would not be suitable. Accordingly, in this case the plates might be fabricated separately and well spaced from one another and an actuator used to bring them into proximity.

The elongate electrical conductors and the contacts could be applied using implantation or nano imprinting technology or any suitable method.

Solid state integrated hinges 40 are very accurate and have very high tolerance. Errors arising from variations in spring constant or web construction details and materials can be controlled and minimised to very low values. The illustrated transducers can function in vacuum, in very aggressive atmospheres, in the presence of strong magnetic and electric fields, in strong radioactive or cosmic radiation, and at exceedingly low or high temperatures.

Reducing the dimensional scale of the transducer devices from the micro to the nano scale in the aforementioned ranges (that is from MEMS to NEMS) should improve performance and reliability of the hinges since, as established by a number of studies, decreasing size is accompanied by a corresponding decrease in the number of defects. Many physical parameters can be controlled to a higher precision with decreasing size. Such parameters include elastic modulus and several other physical properties, especially for silicon. The reliability of solid state web hinges is very high, with lifetimes estimated to be typically over 10 years or over 300 billion cycles of continuous performance.

Numerical and structural analysis of various alternative constructions, for example using finite element methods, is capable of providing optimised solutions for particular applications. In particular, it is possible to select the geometrical structure of the transducer or of the solid state web hinge, the materials, and dimensions, for the optimal parallel motion of the plate, in a selected motion range and required frequency.

Applications of the devices include force meters, flow meters, gyroscopes, vibration meters and accelerometers. An application of particular interest is to surfaces where minimum disturbance to the environment of the measurement is crucial, for example in measuring aerodynamic surfaces in aeroplane or ship design and testing, or computer disk drive testing.

The invention claimed is:

1. A device comprising:
   a first substrate;
   a second substrate mounted on the first substrate by at least one pair of elongated solid state hinges, wherein the pair of solid state hinges are substantially aligned to each other in their elongated direction and are opposing to each other from different sides of the second substrate;
   at least one first elongated electrical conductor extending in a first direction located on a surface of the first substrate facing the second substrate; and
   at least one second elongated electrical conductor extending in a second direction, which is the same as the first direction, located on a surface of the second substrate facing the first substrate;
   wherein:
      the pair of solid state hinges are integral with and linking the first and second substrates to relatively locate the first and second substrates such that the surfaces thereof are parallel and a gap therebetween is maintained at about 15 nm or less such that the first and second elongated electrical conductors are opposed to each other at a distance permitting a detectable quantum tunneling current when a suitable electrical potential difference is applied between the first and second elongated electrical conductors; and
      the at least one pair of solid state hinges are configured to permit a motion of the second substrate in a direction substantially parallel to the surface of the first substrate but substantially prohibit a motion of the second substrate in a direction perpendicular to the surface of the first substrate.

2. The device of claim 1, wherein the at least one pair of solid state hinges are resilient and are dimensioned to have a stiffness in the direction of the motion substantially lower than that in a direction perpendicular to the surface of the second substrate, and wherein the pair of solid state hinges are substantially aligned with each other.

3. The device of claim 1, wherein each of the at least one pair of solid state hinges comprises at least one outstanding pillar or post from one of the first and second substrates and a web integrally joining the pillar to an edge region of the other of the first and second substrates, and wherein the pair of solid state hinges are also configured to provide electrical connections to the first and second elongated conductors.

4. The device of claim 3, wherein the webs of the at least one pair of solid state hinges are in mutual co-planar alignment, wherein the device includes only one pair of elongated solid state hinges, and wherein the pair of elongated solid state hinges substantially point to a center portion of the second substrate.

5. The device of claim 1, wherein the second substrate has an area smaller than that of the first substrate, wherein the device comprises two pairs of solid state hinges, and wherein the two solid state hinges in each pair are substantially aligned.

6. The device of claim 1, wherein:
   the first and second substrates are semiconductor substrates; and
   the first and second elongated electrical conductors are formed using implantation.

7. The device of claim 1, wherein:
   the first and second substrates are semiconductor substrates; and
   the first and second elongated electrical conductors are formed using nano imprinting technology.

8. The device of claim 1, wherein the gap is about 5 nm or less.

9. A device comprising:
   a first substrate;
   a second substrate mounted on the first substrate by at least one pair of elongated solid state hinges, wherein the pair of solid state hinges are substantially aligned to each other along their elongated direction and are opposing to each other from different sides of the second substrate;
   a first plurality of elongated electrical conductors extending in a first direction located on a surface of the first substrate facing the second substrate;
   a second plurality of elongated electrical conductors extending in a second direction which is the same as the first direction, located on a surface of the second substrate facing the first substrate;
   wherein:
      the pair of solid state hinges are integral with and linking the first and second substrates to relatively locate the first and second substrates such that the surfaces thereof are parallel and a gap therebetween is maintained at is about 15 nm or less such that each of the first plurality of elongated electrical conductors are located opposed to a corresponding conductor of the second plurality of elongated electrical conductors at a distance permitting a detectable quantum tunneling current when a suitable electrical potential difference is applied between the first and second elongated electrical conductors; and
      the pair of solid state hinges permit a motion of the second substrate in a direction substantially parallel to the surface of the first substrate but substantially prohibits a motion of the second substrate in a direction perpendicular to the surface of the first substrate, wherein the pair of solid state hinges are also configured to provide electrical connection to at least one of the first or second plurality of elongated electrical conductors.

10. The device of claim 9, wherein the at least one pair of solid state hinges each comprise at least one outstanding pillar or post from one of the first and second substrates and a web integrally joining the pillar to an edge region of the other of the first and second substrates.

11. The device of claim 9, wherein the second substrate has an area smaller than that of the first substrate, wherein the device includes only one pair of elongated solid state hinges, and wherein the pair of elongated solid state hinges substantially point to a center portion of the second substrate.

12. The device of claim 9, wherein:
   the first and second substrates are semiconductor substrates; and
   the first plurality and the second plurality of elongated electrical conductors are formed using implantation.

13. The device of claim 9, wherein:
the first and second substrates are semiconductor substrates; and
the first plurality and the second plurality of elongated electrical conductors are formed using nano imprinting technology.

14. The device of claim 9, wherein:
the device includes only four solid state hinges mounting the second substrate on the first substrate;
the solid state hinges are equi-angularly spaced with respect to a center of the second substrate,
at least two of the solid state hinges are aligned with the center of the second substrate, and
the motion comprises an angular rotation within the plane of the second substrate.

15. The device of claim 9, wherein the motion comprises an angular rotation.

16. The device of claim 9, wherein a gap between the second substrate and the first substrate is about 5 nm or less.

17. The device of claim 4, wherein the at least one first elongated electrical conductor and the at least one second elongated electrical conductor are a directly opposed pair aligned parallel with a plane of the webs.

18. The device of claim 10, wherein the first plurality of elongated electrical conductors and the second plurality of elongated electrical conductors are disposed in directly opposed pairs aligned parallel with a plane of the web.

19. The device of claim 3, wherein webs of the at least one pair of solid state hinges each are substantially thinner in the motion direction parallel to the surface of the first substrate than in the direction perpendicular to the surface of the first substrate.

20. A device comprising:
a first substrate;
a second substrate mounted over the first substrate by at least one pair of elongated solid state hinges, wherein the pair of solid state hinges are substantially aligned to each other along their elongated direction and are opposing to each other from different sides of the second substrate;
a first elongated electrical conductor located over a surface of the first substrate facing the second substrate; and
a second elongated electrical conductor located over a surface of the second substrate facing the first substrate;
wherein:
the pair of solid state hinges are integral with and linking the first and second substrates to relatively locate the first and second substrates such that the surface of the first substrate and the surface of the second substrate are substantially parallel and that a gap between the two surfaces is maintained at about 15 nm or less such that the first and second elongated electrical conductors have a detectable quantum tunneling current therebetween if a suitable electrical potential difference is applied between the first and second elongated electrical conductors;
the at least one pair of solid state hinges are configured to permit a motion of the second substrate in a direction substantially parallel, but not in a direction perpendicular, to the surface of the second substrate; and
the gap does not substantially vary during said motion.

* * * * *